(12) United States Patent
Cenger et al.

(10) Patent No.: US 9,559,703 B2
(45) Date of Patent: Jan. 31, 2017

(54) SYSTEM READY IN A CLOCK DISTRIBUTION CHIP

(71) Applicant: Hittite Microwave Corporation, Chelmsford, MA (US)

(72) Inventors: Tunc Mahmut Cenger, Gokturk (TR); Gordon John Allan, Ottawa (CA)

(73) Assignee: Hittite Microwave LLC, Chelmsford, MA (US)

( * ) Notice: Subject to any disclaimer, the term of this patent is extended or adjusted under 35 U.S.C. 154(b) by 58 days.

(21) Appl. No.: 14/613,123

(22) Filed: Feb. 3, 2015

(65) Prior Publication Data

US 2015/0222274 A1 Aug. 6, 2015

Related U.S. Application Data

(60) Provisional application No. 61/935,510, filed on Feb. 4, 2014.

(51) Int. Cl.
*H03L 7/06* (2006.01)
*H03L 7/08* (2006.01)
*G06F 1/10* (2006.01)
*G06F 1/06* (2006.01)
*H04L 12/64* (2006.01)

(52) U.S. Cl.
CPC . *H03L 7/08* (2013.01); *G06F 1/06* (2013.01); *G06F 1/10* (2013.01); *H04L 12/6418* (2013.01)

(58) Field of Classification Search
USPC .................. 327/147–149, 156–158
See application file for complete search history.

(56) References Cited

U.S. PATENT DOCUMENTS

| | | | | |
|---|---|---|---|---|
| 5,179,303 | A * | 1/1993 | Searles | H03K 5/131 327/157 |
| 6,259,290 | B1 * | 7/2001 | Takada | H03L 7/0812 327/158 |
| 6,970,047 | B1 * | 11/2005 | Johnson | H03K 5/15013 327/156 |
| 7,683,679 | B2 * | 3/2010 | Cheung | H03K 23/68 327/115 |
| 2001/0028276 | A1 * | 10/2001 | Kim | H03L 7/0893 331/10 |

(Continued)

FOREIGN PATENT DOCUMENTS

| | | |
|---|---|---|
| EP | 0 753 808 A2 | 1/1997 |
| WO | WO 98/37656 A2 | 8/1998 |

OTHER PUBLICATIONS

Extended European Search Report dated Jun. 24, 2015 for European Patent Application No. 15152946.8 filed Jan. 28, 2015, 7 pages.

(Continued)

*Primary Examiner* — Adam Houston
(74) *Attorney, Agent, or Firm* — Knobbe, Martens, Olson & Bear, LLP

(57) ABSTRACT

Provided herein are apparatus and methods for system ready in a clock distribution chip or system. In certain configurations, a communication system includes a clock generation circuit having a divider and phase control circuit to provide output clock signals. The communication system further includes a system ready circuit to provide a system ready signal indicative of whether all of the output clock signals are ready.

20 Claims, 6 Drawing Sheets

(56) References Cited

U.S. PATENT DOCUMENTS

| | | | |
|---|---|---|---|
| 2008/0164917 A1* | 7/2008 | Floyd | H03L 7/1974 327/117 |
| 2009/0261862 A1* | 10/2009 | Nguyen | G01R 19/16552 327/73 |
| 2009/0284318 A1* | 11/2009 | Machado | H03L 7/197 331/16 |
| 2011/0221486 A1 | 9/2011 | Hirata et al. | |
| 2013/0195157 A1* | 8/2013 | Xu | H04L 27/2272 375/219 |
| 2015/0004919 A1* | 1/2015 | Ek | H03L 7/087 455/75 |
| 2015/0222274 A1* | 8/2015 | Cenger | H03L 7/08 327/156 |
| 2016/0105189 A1* | 4/2016 | Maeda | H03L 7/095 327/157 |
| 2016/0241249 A1* | 8/2016 | Balamurugan | H03L 7/00 |

OTHER PUBLICATIONS

Chou, Ju-Ming, "High-Precision Multi-Phase Clock Generation", A Dissertation submitted to Department of Electronics Engineering and Institute of Electronics College of Electrical and Computer Engineering National Chiao-Tung University in partial Fulfillment of the requirements for the Degree of Doctor of Philosophy in Electronics Engineering, Jun. 2007.

Boyd, Barrie, "High Speed Clock Distribution Design Techniques for CDC 509/516/2509/2510/2516," Texas Instruments, Sep. 1998, 22 pages.

Analog Devices, "AD9514 Data Sheet: 1.6 GHz Clock Distribution IC, Dividers, Delay Adjust, Three Outputs," Rev. 0, Jul. 2005, 28 pages.

* cited by examiner

SYSTEM READY IN A CLOCK DISTRIBUTION CHIP

CROSS REFERENCE TO RELATED APPLICATION

This application is a non-provisional of and claims the benefit under 35 U.S.C. §119(e) of U.S. Provisional App. No. 61/935,510, filed Feb. 4, 2014, titled "System Ready in a Clock Distribution Chip," the entire disclosure of which is hereby incorporated by reference herein.

BACKGROUND

Technical Field

The disclosed technology relates to electronic systems, and more particularly, to electronic systems that generate clock signals.

Description of the Related Technology

Clock generation circuits can be implemented in communication systems to provide multiple clock signals for an electronic system. One or more phase locked loops (PLLs) are typically used to recover a noisy reference clock signal, also referred to as a reference signal, and to create stable, low jitter signals. PLLs can be used in, for example, frequency synthesizers, telecommunications systems, chip-to-chip communication systems, the like, or any combination thereof.

Clock generation circuits frequently include a PLL to lock an output clock signal generated by the PLL's voltage controlled oscillator to the phase of an incoming reference clock signal. For instance, a high precision tunable voltage controlled oscillator can be phase-locked to a noisy reference clock signal, and the PLL can operate to suppress phase noise and to attenuate jitter. Clock generation circuits can provide multiple low jitter clock signals derived from a selection of noisy reference clocks in an integrated circuit.

SUMMARY OF CERTAIN INVENTIVE ASPECTS

One aspect of this disclosure is an apparatus that includes a system ready circuit and a divider and phase control circuit. The divider and phase control circuit is configured to receive a reference clock signal and to provide output clock signals. The output clock signals are each frequency divided relative to the reference clock signal. The output clock signals are ready when they each have a set phase relative to another output clock signal of the output clock signals. The system ready circuit is configured to communicate with the divider and phase control circuit and to provide a system ready signal indicative of whether all of the output clock signals are ready.

The output clock signals can each have a set phase relative to a system clock signal when ready, and the system clock signal can have a lower frequency than the reference clock signal.

The divider and phase control circuit can include a plurality of programmable dividers and one or more finite state machines. The plurality of programmable dividers can be configured to frequency divide the reference signal. The one or more finite state machines can be configured to control the programmable dividers so that the output clock signals each have a desired frequency and each have the set phase relative to another output clock signal of the output clock signals.

The one or more state machines can comprise a separate state machine corresponding to each output clock signal. The system ready circuit can be configured to toggle the system ready signal in response to each of the separate state machines being in a done state. Alternatively or additionally, the system ready circuit can be configured to toggle the system ready signal in response to each of the separate state machines ceasing to request a system clock signal having a lower frequency than the reference clock signal.

The one or more state machines can be configured to cause each of the output clock signals to have the set phase relative to another output clock signal of the output clock signals when ready, at least partly, by controlling one or more of the plurality or programmable dividers.

The divider and phase control circuit can comprise a plurality of programmable dividers and a plurality of phase control circuits. The plurality of programmable dividers can each be configured to frequency divide the reference signal. The plurality of phase control circuits can each be configured to receive an output from a respective one of the programmable dividers and adjust a phase of the output from the respective divider.

The output clock signals can each be frequency divided relative to the reference clock signal by an integer divisor.

The system ready circuit can be embodied in a controller in communication with the divider and phase control circuit by way of a bus.

The system ready circuit and the divider and phase control circuit can be embodied within a single chip. The apparatus can be configured to provide the system ready signal to an output contact of the single chip.

The apparatus can further comprise a phase-locked loop. The phase-locked loop can provide the reference clock signal to the divider and phase control circuit.

The apparatus can comprise a second divider and phase control circuit and a second system ready circuit. The second divider and phase control circuit can be configured to receive a first clock signal of the output clock signals from the phase control circuit and to provide second output clock signals. The second output clock signals are frequency divided relative to the first output clock signal of the output clock signals, and each has a set phase relative to another of the second output clock signals when ready. The second system ready circuit can be configured to toggle a second system ready signal in response to an indication that each of the second output clock signals is ready.

Another aspect of this disclosure is a clock distribution chip comprising a phase-locked loop, a divider and phase control circuit, and a controller. The phase-locked loop is configured to generate a reference clock signal. The divider and phase control circuit is configured to receive the reference clock signal from the phase-locked loop and to provide output clock signals that are frequency divided relative to the reference clock signal. Each of the output clock signals has a set phase when ready. The controller is configured to provide, external to the clock distribution chip, a system ready signal indicative of whether each of the output clock signals is ready.

The controller can be configured to receive a lock detect signal from the phase locked loop and to provide a control signal to the divider and phase control circuit responsive to the lock detect signal indicating that the phase locked loop is locked. The clock distribution chip can further comprise an other phase locked loop configured to provide an input to the phase locked loop.

Another aspect of this disclosure is an electronically implemented method of detecting that output clock signals are ready. The method comprises receiving a request to provide output clock signals having desired frequencies and known phases. The method also comprises controlling a divider and phase control circuit such that the divider and phase control circuit generates the output clock signals having the desired frequencies and the known phases. The divider and phase control circuit generates the output clock signals using a reference signal. Additionally, the method comprises monitoring whether the output clock signals are ready and toggling a system ready signal. The system ready signal is toggled in response to determining that each of the output clock signals are ready.

The method can further comprise detecting that a phase locked loop is locked, wherein the phase locked loop provides the reference signal, and wherein controlling is initiated in response to detecting that the phase locked loop is locked. The method can further comprise detecting that an other phase locked loop is locked, wherein the other phase locked loop provides an input to the phase locked loop, and wherein controlling is initiated in response to detecting that the phase locked loop and the other phase locked loop are both locked.

Monitoring whether the output clock signals are ready can comprise detecting whether one or more state machines of the divider and phase control circuit are in a done state and/or detecting whether one or more state machines have ceased to request a system clock signal, the system clock signal having a lower frequency than the reference signal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

These drawings and the associated description herein are provided to illustrate specific embodiments and are not intended to be limiting.

DETAILED DESCRIPTION OF CERTAIN EMBODIMENTS

Figure 1:
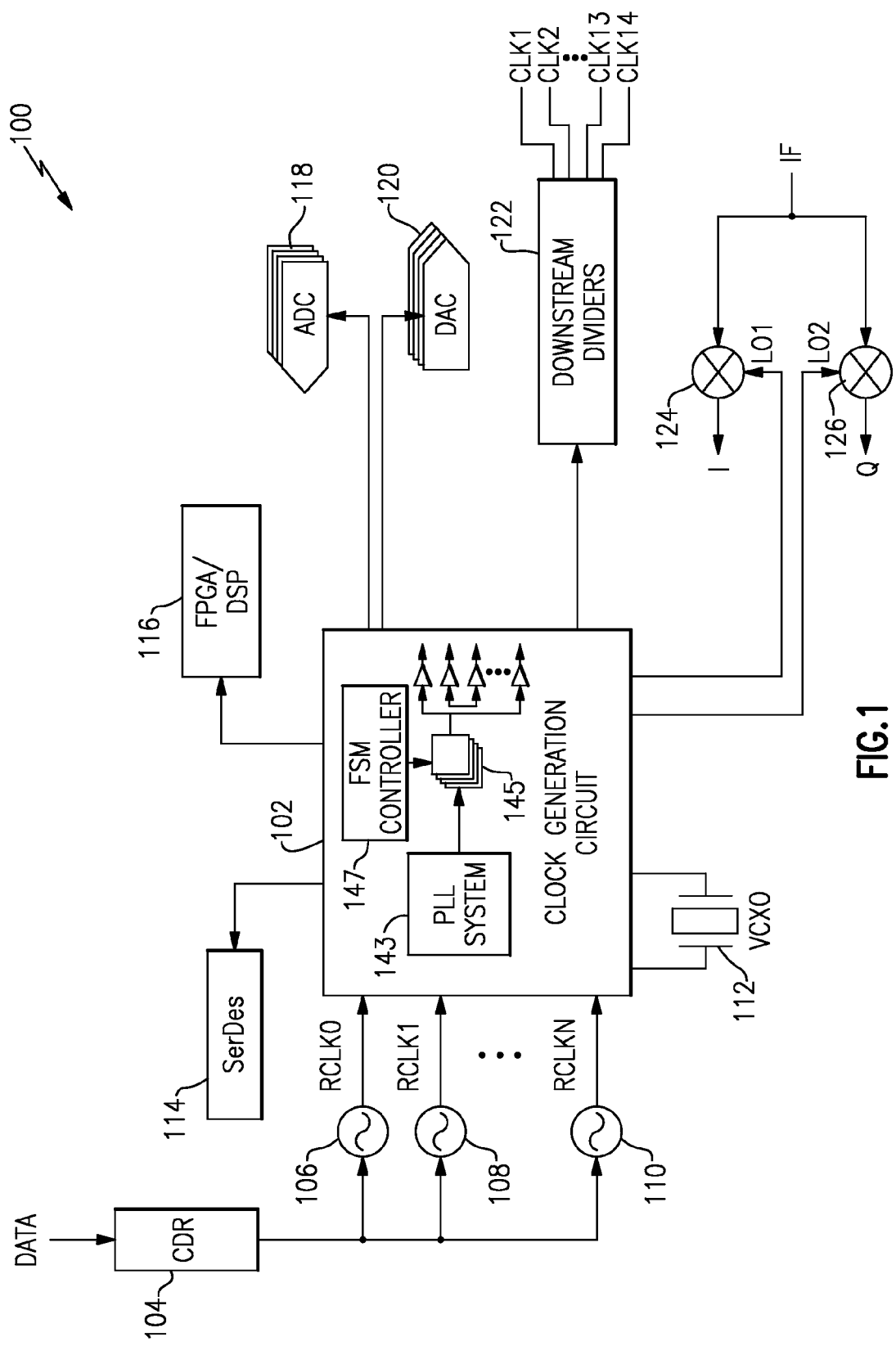
FIG. 1 is a schematic diagram of a communication system including a clock generation circuit according to one embodiment.

The following detailed description of embodiments presents various descriptions of specific embodiments of the invention. However, the invention can be embodied in a multitude of different ways as defined and covered by the claims. In this description, reference is made to the drawings where like reference numerals may indicate identical or functionally similar elements. It will be understood that elements illustrated in the figures are not necessarily drawn to scale. Moreover, it will be understood that systems including the innovations discussed herein can include more elements than illustrated and/or a subset of the illustrated elements in any of the figures.

Clock generation circuits can be implemented in communication systems to provide multiple clock signals for an electronic system. One or more phase locked loops (PLLs) are typically used to recover a noisy reference clock signal, which can also be referred to as a reference signal, and to create relatively stable, low jitter signals. A PLL can be used to lock the reference signal to a voltage controlled crystal oscillator (VCXO), or any stable oscillator. To increase the frequency of the locked signal, two PLLs can be cascaded to generate an output clock signal having a higher frequency than that of the crystal oscillator.

Communications systems typically include a synchronous reference clock signal provided by a network. The network usually distributes the synchronous reference clock signal to each node of the network, where the synchronous reference clock signal is recovered and used locally to synchronize timing.

The synchronous reference clock signal is typically recovered locally as a local reference clock signal having relatively lower noise and jitter. The local reference clock signal, in turn, can provide a relatively stable clean source which is phase locked, by a PLL, to the synchronous reference clock signal. This can provide a reference clock signal at a desired phase and frequency but with better short term jitter and noise.

Sub-systems within the communication system often operate at higher frequencies than the local reference clock signal, but typically operate at integer multiples of the reference clock signal and at known phases. The known phases can be relative to the reference clock signal and/or relative to other local reference clock signals. The known phases can be deterministic. When phase locked, a high frequency voltage control oscillator can be used to generate the other higher frequency clock signals for the sub-systems. A reference clock signal generated from the high frequency voltage controlled oscillator can in turn be divided down by frequency divider circuits to provide a plurality of output clock signals having frequencies typically at integer sub-multiples of the reference clock signal clock frequency.

Frequency divider circuits for high frequency applications can introduce stochastic phase errors. Accordingly, the phase of the plurality of output clock signals preferably can be controlled and set with respect to a system reference signal having lower frequency than each of the plurality of output clock signals. The system reference signal can be provided within the communication system. The system reference signal, which can also be referred to as a golden reference signal, is typically an integer sub-multiple of the reference clock signal clock frequency. For example, the reference clock signal can be provided with a frequency of approximately 122.55 MHz, whereas the system reference signal can be provided with a frequency of approximately 8 kHz.

The plurality of output clock signals can be controlled by a system controller. The system controller can be part of a monolithic integrated circuit chip that includes a divider and phase control circuit that provides the output clock signals. The monolithic integrated circuit can also include one or more phase locked loops. The divider and phase control circuit providing the plurality of output clock signals can be configured by the controller to control both phase and frequency of the output clock signals. The divider and phase control circuitry can provide output clock signals have programmable frequencies and deterministic phases. The controller and/or the divider and phase control circuit can include finite state machines (FSMs) to set phase and frequency of the plurality of output clock signals, one at a time and/or in groups.

Once the controller initiates instructions to configure the output frequencies and phases of the output clock signals, the changes are not implemented instantaneously. Rather, a period of time elapses before the output clock signals have the desired frequencies and phases. For instance, the time period can include time for internal data transfers, finite state machine cycles, calibrations, the like, or any combination thereof. The time period can be treated as the transient time prior to reaching a steady state condition.

An external system receiving the output clock signals is typically unaware when output clock signals from a clock distribution circuit are ready. The period of time from requesting output clock signals having desired frequencies and a known phase relationship until the output clock signals are ready can be application specific and/or can be unknown. Moreover, the output clock signals can have programmable frequencies and it can take different amounts of time for the output clocks having different frequency and phase combinations to settle at the desired frequencies and phases. Accordingly, it can be difficult to know how much time is required to configure, settle and propagate all signals related to completing the task of setting phase and frequency of the plurality of output clock signals. Problems can arise within the system if one or more of the sub-systems are enabled during the period of time to implement the changes. For instance, if a first output clock signal from the plurality of output clock signals is not ready, in an unknown state, then a system error or race condition could occur. On the other hand, waiting for a long period of time to ensure that all of the output clock signals have settled can cause the system to be idle when the output clock signals are ready, thereby reducing performance.

Accordingly, limitations of previous clock distribution systems providing output clock signals before they are ready can cause system errors and waiting a long period of time to ensure that all of the output clock signals have settled can adversely impact performance. Moreover, such limitations can be unacceptable for certain applications and/or clocking systems under strict timing constraints. Determining when clock distribution systems are ready can be particularly desirable for systems with data converter and processor blocks that utilize both parallel and serial data transfers. Such systems can support the JESD204B signaling standard, for example. The system ready notification disclosed herein can allow for efficiently transmitting the status of clock output signals across the system.

Provided herein are apparatus and methods for providing a system ready signal in a clock distribution chip or system. The system ready signal can provide an indication of whether the output clock signals from a clock distribution circuit have a desired frequency and known phase relationship. Clock distribution circuits discussed herein can notify an external user, by way of a system ready signal, which can also be referred to as a system ready flag. The system ready flag can be a real time hardware output to a logic pin or other output contact of the clock distribution chip, or it can be an internal flag, which is set in a register within the clock distribution system for observation or polling by a state machine and/or system controller. The system ready flag can notify a user when the system is configured and the plurality of output clocks are ready or not ready for distribution.

In addition to providing the system ready flag, the clock distribution circuit can also include features to distribute the plurality of output clock signals with well-defined and/or deterministic phase relationships.

FIG. 1 is a schematic diagram of a communication system 100 that includes a clock generation circuit according to one embodiment. The communication system 100 includes a clock generation circuit 102, a clock and data recovery (CDR) circuit 104, a first input reference clock generator 106, a second input reference clock generator 108, a third input reference clock generator 110, a high precision tunable oscillator or VCXO 112, a serializer/deserializer (SerDes) circuit 114, a field programmable gate array (FPGA)/digital signal processor (DSP) 116, analog-to-digital converter (ADC) circuits 118, digital-to-analog converter (DAC) circuits 120, downstream dividers 122, a first mixer 124, and a second mixer 126.

The communication system 100 can be used in a variety of applications, including, for example, cellular infrastructure applications. For example, the communication system 100 can represent a portion of a base station.

As shown in FIG. 1, the clock generation circuit 102 receives a plurality of input clock reference clock signals including a first input reference clock signal RCLK0, a second input reference clock signal RLCK1, and a third input reference clock signal RCLKN. Although FIG. 1 illustrates the clock generation circuit 102 as receiving three reference clock signals, the clock generation circuit 102 can receive more or fewer input reference clock signals. For example, in one embodiment the clock generation circuit 102 receives N input reference clock signals, where N is an integer selected to be in the range from about 2 to about 4. In the illustrated configuration, the reference clock signals are derived from the CDR circuit 104. For example, the input reference clock signals can correspond to recovered clock signals from clock and data recovery operations of the CDR circuit 104 on a data stream (DATA). However, other configurations are possible, such as configurations in which all or part of the reference clock signals are generated in other ways. In one embodiment, the reference clock signals include at least one input reference clock signal generated using a reference oscillator, such a free-running oscillator that operates open-loop.

In the illustrated configuration, the clock generation circuit 102 can generate output clock signals based on a selected or active reference clock signal chosen from the reference clock signals RCLK0-RCLKN. For example, the clock generation circuit 102 can use one active or primary reference signal, for example, the first reference clock signal RCLK0, which is used to generate the output clock signals. Additionally, the other reference clock signals RCLK1-RCLKN can serve as back-up clock reference signals should the first reference clock signal RCLK0 become invalid or dropped.

The clock generation circuit 102 can generate stable high-frequency low-jitter clock signals for a variety of circuits. For example, in the illustrated configuration, the clock generation circuit 102 generates clock signals for the SerDes circuit 114, the FPGA/DSP 116, the ADC circuits 118, the DAC circuits 120, the downstream dividers 122, and first and second mixers 124, 126 for modulating in-phase (I) and quadrature-phase (Q) components of an intermediate frequency (IF) signal. In certain configurations, one or more output clock signals generated by the clock generation circuit 102 can be further processes to generate additional clock signals. For example, in the illustrated configuration, the downstream dividers 122 provide division operations to generate a plurality of clock signals (CLK1, CLK2, . . . CLK13, CLK14, in this example). Although one example of circuits that can receive clock signals form the clock generation circuit 102 has been shown, the clock generation circuit 102 can generate clock signals for other circuitry. Thus, the illustrated communication system 100 depicts various non-limiting examples of circuitry that can receive clock signals from the clock generation circuit 102.

The output clock signals generated by the clock generation circuit 102 can be specified to have high stability, low phase noise, and/or low jitter. However, at least a portion of the reference clock signals RCLK0, RCLK1, and RCLKN can be noisy and/or intermittent.

To meet or exceed performance specifications, the clock generation circuit 102 can include a PLL system 143 having one or more PLL's, which can be used to lock the phase of the VCXO 112 to the selected reference clock signal. In certain configurations, the VCXO 112 comprises a tunable crystal oscillator. However, the teachings herein are applicable to other types of controllable oscillators, including, for example, inductor-capacitor (LC) tank oscillators, ring oscillators, and/or rotary traveling wave oscillators (RTWOs).

As illustrated, the clock generation circuit includes a PLL system 143, a divider and phase control circuit 145, and a finite state machine controller 147. The clock generation circuit 102 can include more elements than illustrated and/or a subset of the illustrated elements. The PLL system 143 can provide a reference clock signal to the divider and phase control circuit 145. The PLL 143 can include one or more PLLs. In one embodiment the PLL system 143 can include two PLLs. The state machine controller 147 can communicate with the divider and phase control circuit 145 to provide inputs to request that output clock signals have desired frequencies. The state machine controller 147 can determine when the output clock signals provided by the clock generation circuit 102 are ready and provide a system ready signal indicative of whether the output clock signals are ready. The output clock signals can be ready when they are in a steady-state in which they have a desired frequency and known phase.

Figure 2:
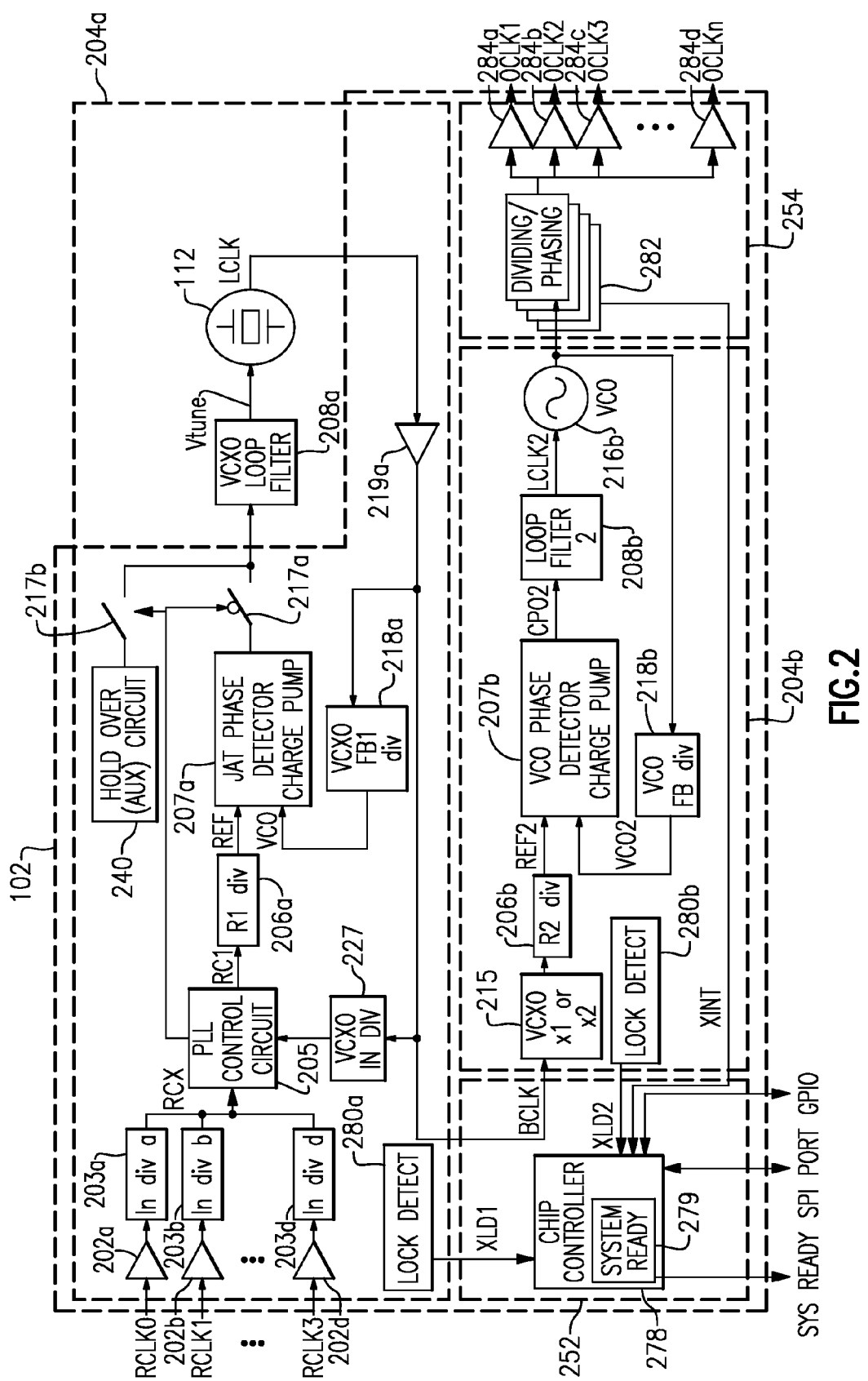
FIG. 2 is a schematic diagram of a clock generation circuit having a controller and a divider and phase control circuit according to one embodiment.

FIG. 2 is a schematic diagram of a clock generation circuit 102 having a control module 252 and a divider and phase control circuit 254 according to one embodiment. The clock generation circuit 102 of FIG. 2 further includes a first PLL 204a and a second PLL 204b. The clock generation circuit 102 of FIG. 2 is an example of the clock generation circuit 102 of FIG. 1. For example, in certain embodiments, the first PLL 204a and the second PLL 204b can be included in, the control module 252 can implement the state machine controller 147 of FIG. 1, and the divider and phase control circuit 254 can implement the divider and phase control circuit 145 of FIG. 1. The illustrated first PLL 204a includes a first reference clock buffer 202a, a second reference clock buffer 202b, a third reference clock buffer 202c, a fourth reference clock buffer 202d, a first reference clock divider 203a, a second reference clock divider 203b, a third reference clock divider 203c, a fourth reference clock divider 203d, a PLL control circuit 205, a first VCXO divider 227, a first clock buffer 284a, a second clock buffer 284b, a third clock buffer 284c, and a fourth clock buffer 284d.

In the illustrated configuration, the clock generation circuit 102 receives a first input reference clock signal RCLK0, a second input reference clock signal RCLK1, and a third input reference clock signal RCLK3. Additionally, the illustrated clock generation circuit 102 generates a first output clock signal OCLK1, a second output clock signal OCLK2, a third output clock signal OCLK3, and a fourth output clock signal OCLKn. Although FIG. 2 illustrates a configuration in which a clock generation circuit receives three input reference clock signals and generates four output clock signals, the teachings herein are applicable to clock generation circuits that receive more or fewer input reference clock signals and/or that generate more or fewer output clock signals.

As shown in FIG. 2, the first reference clock buffer 202a is used to buffer the first input reference clock signal RCLK0 to generate a first buffered reference clock signal, which is divided using the first reference clock divider 203a to an output node of the first reference clock divider 203a. Additionally, the second reference clock buffer 202b and the second reference clock divider 203b are used to buffer and divide the second reference clock signal RCLK1 to an output node of the second reference clock divider 203b. Furthermore, the third reference clock buffer 202c and the third reference clock divider 203c are used to buffer and divide the third reference clock signal RCLK3 to an output node of the third reference clock divider 203c. The output node of the first reference clock divider 203a, the output node of the second reference clock divider 203b, and the output node of the third reference clock divider 203c are electrically coupled to provide the OR connected signal RCX to an input of the PLL control circuit 205. The illustrated configuration illustrates one example of clock signal conditioning that can occur on one or more reference clock signals before they are provided to a PLL control circuit. However, the teachings herein are applicable to other configurations, including implementations in which one or more of the reference clock signals are not conditioned.

The PLL control circuit 205 generates a first PLL input clock signal RC1, which is provided as an input to a first input frequency divider 206a to produce a divided reference signal REF. The PLL control circuit 205 can further be used to monitor when the OR connected signal RCX is unreliable.

As shown in FIG. 2, the first PLL 204a generates a local clock signal LCLK from the first PLL input clock signal RC1. In certain configurations, the first PLL 204a can be implemented to have a relatively low loop bandwidth to provide a relatively high amount of jitter attenuation. For example, first PLL input clock signal RC1 can be a noisy and/or intermittent signal, and implementing the first PLL 204a with relatively low loop bandwidth can decrease jitter of the local clock signal LCLK. In the illustrated configuration, the second PLL 204b uses a buffered version of the local clock signal LCLK as a reference clock signal for frequency synthesis. Cascading two or more PLLs in this manner can aid in decreasing phase noise and/or lowering jitter in output clock signals generated by the clock generation circuit 102. Although FIG. 2 illustrates a configuration using a cascade of two PLLs, the teachings herein are applicable to clock generation circuits using more or fewer PLLs.

In the illustrated configuration, the first PLL 204 includes a first phase-frequency detector and charge pump (PFD/CP) 207a, a charge pump output switch 217a, a first loop filter 208a, the VCXO 112, a clock buffer 219a, and a first feedback divider 218a. The clock buffer 219a buffers the local clock signal LCLK to generate a buffered clock signal BCLK, which is divided using the first feedback divider 218a to generate a first feedback clock signal VCO for the first PFD/CP 207a. The charge pump output switch 217a receives a tristate signal TM, which is used to selectively disable the feedback loop of the first PLL 204a. The output of the holdover circuit 240 is also electrically connected to the input of the first loop filter 208a via a holdover switch 217b. The first loop filter 208a generates a first tuning voltage Vtune, which is provided as an input to the VCXO 216a. The VCXO 216a generates the local clock signal LCLK, which can have a frequency of oscillation that changes with a voltage level of the tuning voltage Vtune.

In certain configurations, the second PLL 204b can be a high frequency PLL designed to receive the buffered input clock BCLK of low frequency, for instance approximately 122.88 MHz, and to provide a second local clock signal LCLK2 of higher frequency, for instance approximately 2457.6 MHz, to the dividing and phasing block 282.

The dividing and phasing block 282 can generate clock signals that are frequency divided relative to the output of the second PLL 204b and have a known phase. Clock buffers 284a-284d can buffer the clock signals generated by the dividing and phase block 282.

In the illustrated configuration, the second PLL 204b includes a second VCXO divider 215, a second input clock divider 206b, a second PFD/CP 207b, a second loop filter 208b, a voltage controlled oscillator 216b, and a second feedback divider 218b. In certain embodiments, the general operation of the second PLL 204b can be similar to that of the first PLL 204a except it does not use the holdover circuit with a holdover switch nor does it use a charge pump output switch. The voltage controlled oscillator 216b can be a high frequency voltage controlled oscillator and can be phase locked to generate a reference clock signal LCLK2, which is provided as an input to the second feedback divider 218b and as an input to the dividing and phasing block 282.

The control module 252 and the divider and phase control circuit 254 can determine when the output clock signals OCLK1 to OCLKn are ready. Before the output clock signals OCLK1 to OCLKn can be provided within the system, both the first PLL 204a and the second PLL 204b should achieve phase lock and operate in a steady state condition. The control module 252 can receive a first lock detect signal XLD1 from a first lock detect circuit 280a of the first PLL 204a and a second lock detect signal XLD2 from a second lock detect circuit 280b of the second PLL 204b. If either the first PLL 204a or the second PLL 204b has not reached phase lock, then a controller 278 within the control module 252 can disable the divider and phase control circuit 254 or set the divider and phase control circuit 254 to a waiting state. Information communicated between the divider and phase control circuit 254 and the control module 252 can occur via a bus that carries internal control signals XINT. When both the first PLL 204a and the second PLL 204b reach phase lock, then the first lock detect circuit 280a can send the first lock detect signal XLD1 indicating the first PLL 204a has achieved lock, and the second lock detect circuit 280b can send the second lock detect signal XLD2 indicating the second PLL 204b has achieved lock. At this point, the controller 278 can change a logic state of a selected one of the internal control signal XINT to initiate output clock configuration operations to condition the output clock signals to have desire frequencies and known phases. Alternatively, the clock detect signals XLD1 and XLD2 can be provided to circuitry in the dividing and phasing block 282 and such circuitry can provide an indication of whether both of the PLLs are locked. The internal control signals XINT can carry information between the controller 278 and finite state machines of the dividing and phasing block 282. For instance, the internal control signals XINT can provide information to the finite state machines to set one or more of the output clock signals at desired frequency and/or an indication as to whether one or more of the finite state machines have completed operations such that the output clock signals have desired frequencies and known phases. Upon completion of the output clock configuration operations, the controller 278 can change the state of a system ready signal SysReady to indicate that the output clock signals OCLK1 to OCLKn are ready. As shown in FIG. 2, the system ready signal SysReady can be provided by a system ready circuit 279 of the controller 278. Completion of all operations defined by the output clock configuration operations can define when the system is ready. Communication between the controller 278 and the divider and phase control circuit 254 can allow the controller 278 to detect whether all of the output clocks OCLK1 to OCLKn are ready and to change the state of the system ready signal SysReady.

The system ready signal SysReady can provide an indication to components or system blocks external to the clock generation circuit 102 that the output clock signals are ready. This can be advantageous in a variety of contexts and, particularly, in clock distribution systems that include data converter and processing blocks. As one example, the system ready signal SysReady can be used with systems which support JESD204B signaling standard. In this protocol the system ready signal SysReady can enhance the efficiency for transmitting the status of clock outputs across the system.

Figure 3:
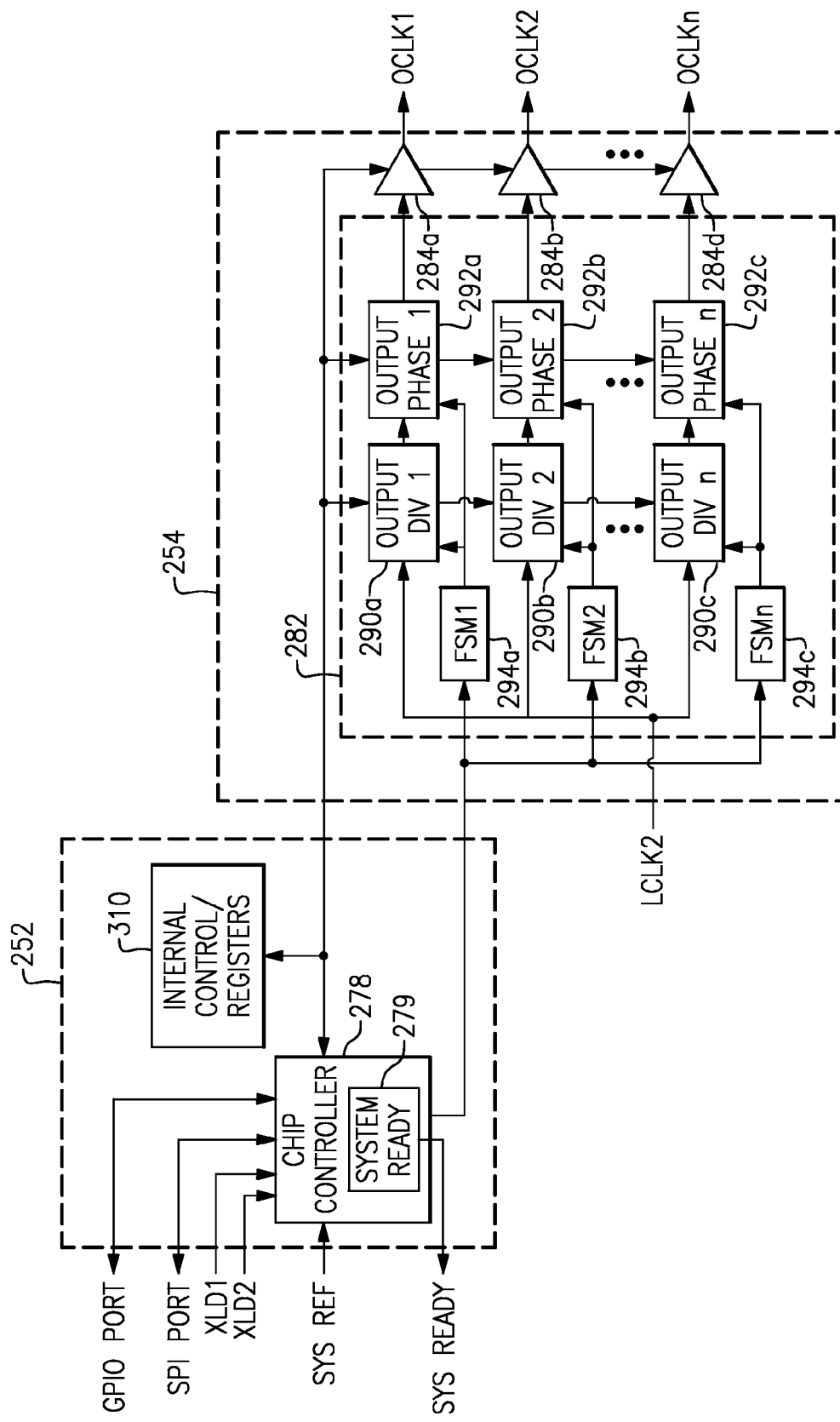
FIG. 3 is a schematic diagram showing a controller and a divider and phase control circuit from a clock generation circuit according to one embodiment.

In addition to receiving information from the first lock detect circuit 280a and the second lock detect circuit 280b, the controller 278 within the control module 252 can also receive signals external to the clock generation circuit 102. The controller 278 can support serial port interface (SPI) communication, other types of interrupts, general purpose input output (GPIO) communication, the like, or any combination thereof FIG. 3 is a schematic diagram of a control module 252 and a divider and phase control circuit 254 of a clock generation circuit according to one embodiment. The control module 252 and the divider and phase control circuit 254 of FIG. 3 are example embodiments of the control module 252 and the divider and phase control circuit 254 of the clock generation circuit 102 of FIG. 2. In the configuration of FIG. 3, further details of an example embodiment of the divider and phase control circuit 254 and the control module 252 are provided.

In FIG. 3, a divider and phase control circuit 254 is configured to receive a reference clock signal LCLK2 and to provide output clock signals OCLK1 to OCLKn. The output clock signals OCLK1 to OCLKn are frequency divided relative to the reference clock signal LCLK2. The output clock signals OCLK1 to OCLKn each have a set phase relative to another output clock signal of the output clock signals when ready. A system ready circuit 279 of the control module 252 is in communication with the divider and phase control circuit 254. The system ready 279 is circuit configured to provide a system ready signal SysReady indicative of whether all of the output clock signals OCLK1 to OCLKn are ready. Accordingly, the system ready signal SysReady can be provided external to a clock distribution chip to indicate when all of the output clocks OCLK1 to OCLKn are ready.

As illustrated, the divider and phase control circuit 254 receives the reference clock signal LCLK2 and provides the output clock signals OCLK1, OCLK2, and OCLKn. As discussed in connection with FIG. 2, the output clock signals OCLK1, OCLK2, and OCLKn can be provided at the outputs of the clock buffers 284a to 284d, respectively. In addition, the divider and phase control block 254 can receive control signals from the control module 252 for setting the frequency and/or the phase of the output clock signals OCLK1, OCLK2, and OCLKn. The divider and phase control block 254 can transmit status signals to the control module 252 to signal when the output clock signals OCLK1, OCLK2, and OCLKn are ready. The output clock signals OCLK1, OCLK2, and OCLKn can be ready when all of these signals have reached a steady state in which the frequency is stable and the output clock signals have a set phase relationship relative to each other. Additionally, upon reaching the steady state the output clock signals can settle to their intended frequencies and phases. Communication between the divider and phase control circuit 254 and the control module 252 can be implemented using one or more buses.

Although FIG. 3 illustrates a configuration in which the divider and phase control circuit 254 can generate three output clock signals, the teachings herein are applicable to divider and phase control circuit circuits that that generate more or fewer output clock signals.

The divider and phase control circuit 254 of FIG. 3 includes the dividing and phasing block 282. The illustrated dividing and phasing block 282 includes three parallel signal paths: a first signal path having a first output divider 290a which receives the reference clock signal LCLK2 and provides a frequency divided version of the reference clock signal, and a first output phasing circuit 292a which receives the frequency divided version of the reference clock signal and provides an input of the first clock buffer 284a having a phase adjusted relative to the frequency divided version of the reference clock signal; a second signal path having a second output divider 290b which receives the reference clock signal LCLK2 and provides a second frequency divided version of the reference clock signal, and a second output phasing circuit 292b which receives the second frequency divided version of the reference clock signal and provides an input of the second clock buffer 284b having a phase adjusted relative to the second frequency divided version of the reference clock signal; and a third signal path having a third output divider 290c which receives the reference clock signal LCLK2 and provides a third frequency divided version of the reference clock signal, and a third output phasing circuit 292c which receives the third frequency divided version of the reference clock signal and provides an input of the fourth clock buffer 284d having a phase adjusted relative to the third frequency divided version of the reference clock signal. Each signal path serves the purpose of dividing frequency and shifting phase of the reference clock signal LCLK2 by an amount determined by control signals from the controller 278.

Although FIG. 3 illustrates a configuration in which the dividing and phasing block 282 shows three parallel signal paths, the teachings herein are applicable to dividing and phasing blocks that include more or fewer signal paths.

In order to individually control phase and frequency of the output clock signals OCLK1, OCLK2, and OCLKn, the dividing and phasing block 282 can include a first finite state machine 294a, a second finite state machine 294b, and a third finite state machine 294c. Each of these finite state machines can receive one or more control signals from the controller 278. Response to a control signal from the controller 278, the first finite state machine 294a can send one or more control signals to the first output divider 290a and to the first output phasing circuit 292a to control frequency and phase of the first output clock signal OCLK1. Similarly, the second finite state machine 294b can send one or more control signals to the second output divider 290b and to the second output phasing circuit 292b to control frequency and phase of the second output clock signal OCLK2. And the third finite state machine 294c can send one or more control signals to the third output divider 290c and to the third output phasing circuit 292c to control frequency and phase of the n-th output clock signal OCLKn. In certain embodiments, the output dividers 290a to 290c can be controlled by finite state machines 290a to 294c, respectively, to cause both the frequency and phase of the output clock signals OCLK1 to OCLKn, respectively, to be adjusted as will be discussed in more detail below. According to some embodiments (not illustrated), one or more of the finite state machines can be physically implemented in the controller 278.

In order to set the relative phases of the output clock signals OCLK1, OCLK2, and OCLKn, the controller 278 can use the low frequency reference signal SysRef having a frequency that is lower than the reference clock signal LCLK2. In addition, the controller 278 can communicate with the first finite state machine 294a, the second finite state machine 294b, and the third finite state machine 294c to perform various output clock configurationoperations. Output clock configuration operations can include changing a frequency division factor for a set period of time or skipping a fixed number of cycles for a set period time. For instance, the controller 278 can communicate with the first finite state machine 294a to control the phase of the first output clock signal OCLK1 relative to the low frequency reference signal SysRef using variable frequency division. For a fixed period of time, the controller 278 can control the first finite state machine 294a to cause the first output frequency divider 290a to frequency divide the reference signal LCKL2 by a factor of M, where M is an integer such as 11, and then the controller 278 can control the first FSM2 294a to cause the first output frequency divider 290a to frequency divide the reference signal LCKL2 by a factor of L, where L is a different integer such as 10 and L corresponds to a divisor that will result in the first output clock signal OCLK1 having a desired output frequency. In one example, the first frequency divider 290a can provide a division factor of 10, then be controlled to have a division ration of 11 for one clock cycle, and subsequently controlled to have a division ratio of 10. This can cause the output of the frequency divider 290a to be phase shifted at a known phase relative to the low frequency reference signal SysRef. The other frequency dividers can be similarly controlled by respective finite state machines. Accordingly, the frequency dividers can be controlled such that each of their respective outputs have a known phase relative to the low frequency reference signal SysRef. Consequently, each of the output clock signals can have a set phase relative to another of the output clock signals. As an another example, the controller 278 can control the third FSMn 294c to cause the third phasing circuit 292c to skip a predetermined number of clock cycles of the n-th output clock signal OCLKn.

Although the above discussion provides a description of controlling the relative phases of the output clocks OCLK1, OCLK2, and OCLKn for illustrative purposes, there are a number of other suitable ways of controlling the relative phases of the output clock signals OCLK1, OCLK2, and OCLKn with respect to the system reference signal SysRef and/or relative to each other.

When the first finite state machine 294a, the second finite state machine 294b, and the third finite state machine 294c have completed their respective output clock configuration operations, the output clock signals OCLK1, OCLK2, and OCLKn should be in the steady state. The controller 278, can use the end-of-cycle or a completion flag from the first finite state machine 294a, the second finite state machine 294b, and the third finite state machine 294c to cause the system ready signal SysReady to change to a ready state. For instance, the system ready circuit 279 can toggle the system ready signal SysReady responsive to each of the finite state machines being in a done state. In this example, the system ready circuit 279 can perform a logical AND function on indications of each of the finite state machines controlling output dividers being in a done state to generate the system ready signal SysReady. As another example, the system ready circuit 279 can toggle the system ready signal SysReady responsive to each of the finite state machines ceasing to request a clock signal for a threshold period of time.

The output dividers 290a-290c, the phase control circuits 292a-292c, and/or the clock buffers 284a, 284b, and 284d may be controlled individually and/or in groups by the controller 278. In general, any command which changes the state of the divider and phase control circuit 254 can result in a delay before implementation is complete. In this situation, the controller 278 will indicate a not ready state via a state of the system ready signal SysReady. In general, the controller 278 may be configured to indicate a ready status on a dedicated hardware pin (e.g., a GPIO pin), other contact of a chip (e.g., a bump in a flip-chip implementation), or by way of a register 310 that is accessible to an external host system.

Figure 4:
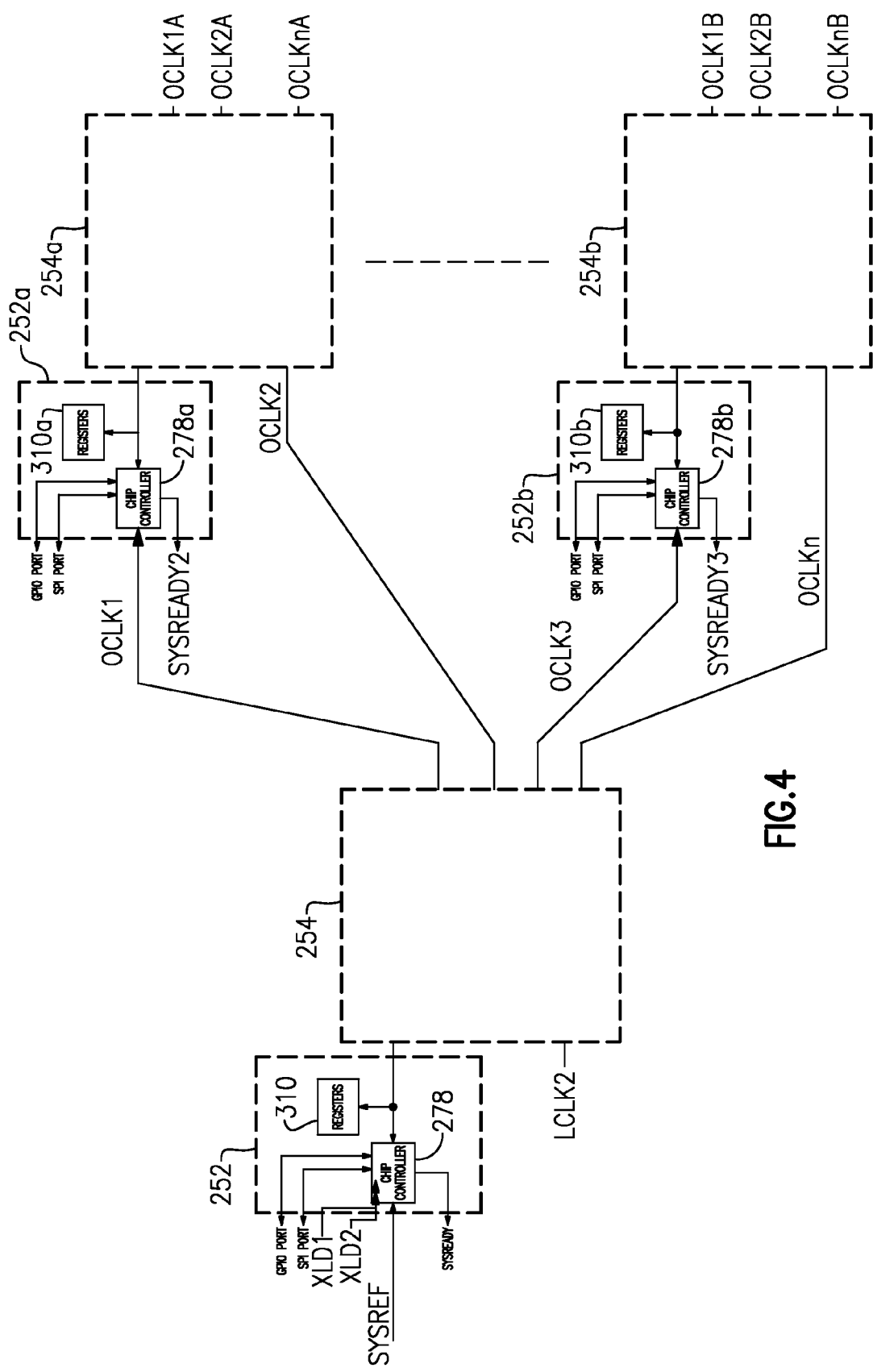
FIG. 4 is a schematic diagram showing a cascaded implementation of multiple divider and phase control circuits of a clock generation circuit according to an embodiment.

FIG. 4 is a schematic diagram illustrating a cascaded implementation of multiple divider and phase control circuits of a clock generation circuit according to another embodiment. The cascaded implementation can include multiple instantiations of the control module 252 and the divider and phase control circuit 254 of the embodiment of FIG. 3. As in the discussion in connection with FIG. 3, the controller 278 within the control module 252 can communicate with the divider and phase control circuit 254 to perform output clock configuration operations for the output clock signals OCLK1 to OCLKn and to provide a system ready flag SysReady. Such output clock configuration operations can include adjusting frequency and/or phase of output clock signals such that these output clock signals have desired frequencies and known phases relative to each other. The plurality of divider and phase control circuits with control modules further includes a second divider and phase control circuit 254a with a second control module 252a to perform output clock configuration operations for a second set of output clock signals OCLK1A, OCLK2A, and OCLKnA and to provide a second system ready flag SysReady2. The second system ready flag SysReady2 can indicate when the output clock configuration operations of the second set of output clock signals OCLK1A, OCLK2A, and OCLKnA have completed. Additionally, the plurality of divider and phase control circuits with control modules of FIG. 4 further includes a third divider and phase control circuit 254b with a third control module 252b to perform output clock configuration operations of a third set of output clocks OCLK1B, OCLK2B, and OCLKnB and to provide a third system ready flag SysReady3. The third system ready flag SysReady3 can indicate when the output clock configuration operations of the third set of output clocks OCLK1B, OCLK2B, and OCLKnB have completed.

The control module 252 can initiate output clock configuration operations, which can align phases of the output clocks OCLK1 to OCLKn with respect to the system reference SysRef. When the output clock configuration operations of the output clock signals have completed, then the controller 278 within control module 252 can provide the system ready flag SysReady to indicate a ready condition.

The system ready flag SysReady can further be used to initiate control sequences within the second control module 252a and the third control module 252b in the cascade. Also, as discussed with respect to the embodiment of FIG. 3, signal paths of the divider and phase control circuit 254 receive the reference clock signal LCLK2; the reference clock signal LCLK2 undergoes frequency division and phase shifting relative to the system reference SysRef in providing the output clocks output clock signals OCLK1 to OCLKn.

The second control module 252a can initiate output clock configuration operations, which can align phases of the second set of output clock signals OCLK1A, OCLK2A, and OCLKnA with respect to the first output clock signal OCLK1. When the output clock configuration operations of the second set of output clock signals have completed, then the second control module 252a can cause a second system ready flag SysReady2 to indicate a ready condition for the second set of output clock signals OCLK1A, OCLK2A, and OCLK4n. In the cascaded configuration of FIG. 4, signal paths of the divider and phase control circuit 254a receive the second output clock signal OCLK2 from the output clock signals OCLK1 to OCLKn. The second output clock signal OCLK2, undergoes frequency division and phase shifting relative to the first cascade output clock signal OCLK1 in providing the output clocks output clocks OCLK1A, OCLK2A, and OCLKnA.

In a similar manner, the third control module 252b can initiate output clock configuration operations and can align phases of the third set of output clock signals OCLK1B, OCLK2B, and OCLKnB with respect to the third output clock signal OCLK3 from the output clock signals OCLK1 to OCLKn. When the output clock configuration operations of the third set of output clock signals have completed, then the third control module 252b can cause a third system ready flag SysReady3 to indicate a ready condition for the third set of output clock signals OCLK1B, OCLK2B, and OCLKnB. In the cascaded configuration of FIG. 4, signal paths of the divider and phase control circuit 254b receive the n-th output clock signal OCLKn from the output clock signals OCLK1 to OCLKn. The n-th output clock signal OCLKn undergoes frequency division and phase shifting relative to the third output clock signal OCLK3 in providing the output clock signals OCLK1B, OCLK2B, and OCLK4n.

Although FIG. 4 illustrates a configuration in which the divider and phase control circuit 254 cascades to the second divider and phase control circuit 254a with the second control module 252a and to the third divider and phase control circuit 254b with the third control module 252b, the teachings herein are applicable to configurations which cascade to more or fewer divider and phase control circuits with control modules.

Figure 5:
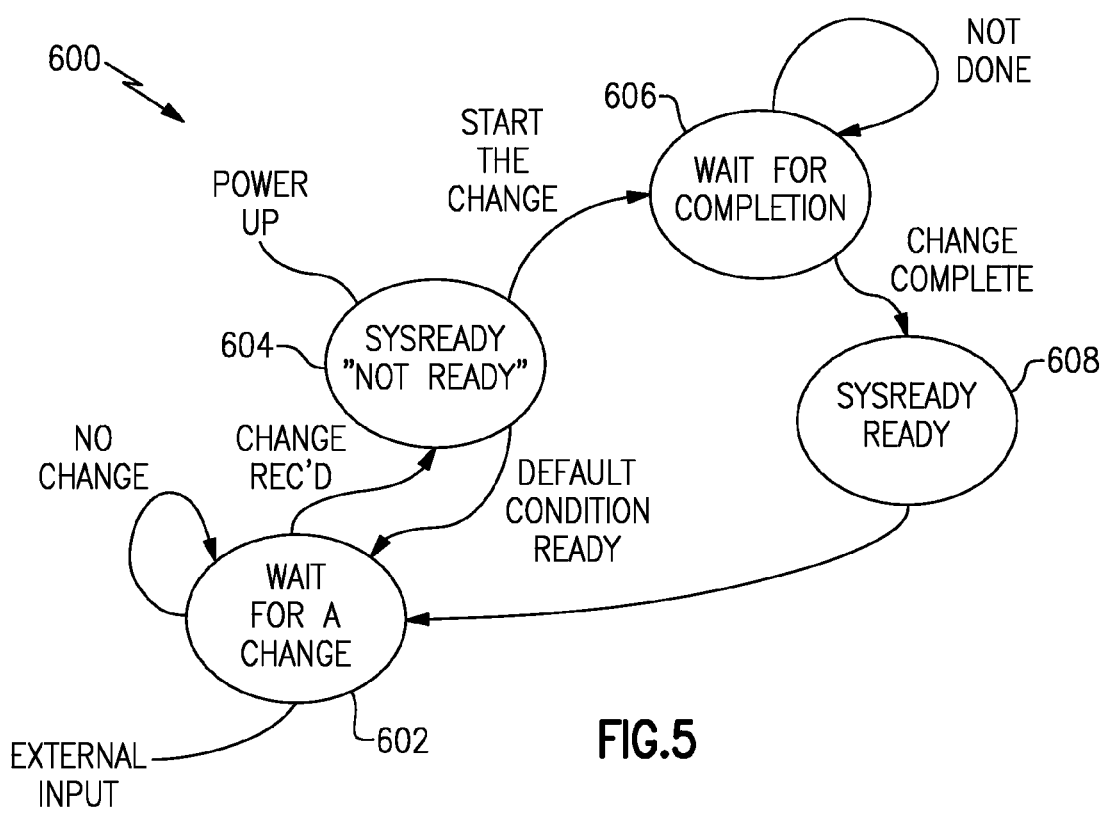
FIG. 5 is a state diagram of a phase control system of a clock generation circuit according to one embodiment.

FIG. 5 is a state diagram 600 of a phase control system of a clock generation circuit according to one embodiment. FIG. 5 summarizes the states of a system ready signal, such as the system ready signal SysReady of FIGS. 2 and/or 3. At state 602, the system waits for a change based upon an external input. An external input may refer to any signal external to the clock generation circuit 102 of FIG. 2. If the external input indicates a request for a change (e.g., a change in frequency of an output clock signal), then there is a change in state from the state 602 to state 604. The second state 604 pertains to circuit power and phase lock. If the clock generation circuit 102 is enabled, has power, and the first PLL 204a and the second PLL 204b have indicated phase lock is true, then there can be a change of state to state 606 or to the state 602. The system ready signal SysReady should indicate not ready when power is initially applied. Once power, such as a voltage source, is applied, then the controller 278 can perform power on reset functions and be in a default power on state, which will normally cause the "Not Ready" condition, the second state 604. Upon receipt of any change of state command, which affects the state of the output clock signals OCLK1 to OCLKn of FIG. 3, the controller 278 can change the system ready signal SysReady to transition to the second state 604, the "not ready" state. The return to the initial state 604 from the second state 604 occurs if there is no request for modifying a phase or a frequency of an output clock signal of the output clock signals OCLK1 to OCLKn of FIG. 3. However, when there is a request for a change in phase and/or frequency, then the controller 278 can communicate with finite state machines within the divider and phase control circuit 254 to start the change and to enter state 606. The state 606 is a state during which the output clock configuration operations are performed with finite state machines within the divider and phase control circuit 254. The state 606 can be maintained until the first finite state machine 294*a*, the second finite state machine 294*b*, and the third finite state machine 294*c* of the divider and phase control circuit 254 indicate that output clock configuration operations are complete. Upon completion of the output clock configuration operations, the controller 278 can change state to state 608, which is a "ready state" where the controller 278 toggles the system ready signal SysReady to indicate that the output clock signals are ready. At this point, the sequence of states can cycle back to the state 602 and the controller 278 can wait for a next command.

Figure 6:
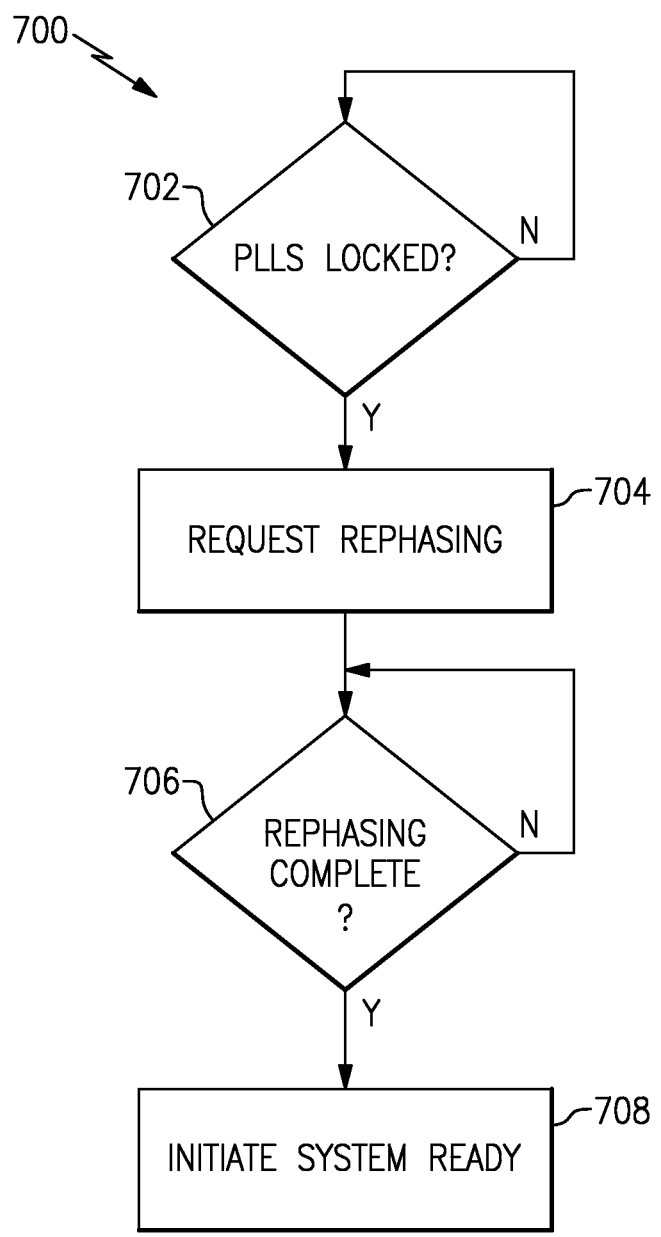
FIG. 6 is a flow diagram of a process of determining that output clock signals are ready according to one embodiment.

FIG. 6 is a flow diagram of a process 700 of determining that output clock signals of a clock generation circuit are ready according to one embodiment. At decision block 702, the process can determine whether one or more phase locked loops are locked. For instance, electronic circuity can determine that the first lock detect signal XLD1 and the second lock detect signal XLD2 of FIG. 2 each indicate that a respective phase locked loop is locked.

When the phase locked loop(s) are not locked, the process 700 can continue to monitor whether the phase locked loops are locked at block 702. On the other hand, when the phase locked loop(s) are locked, the process 700 can proceed to block 704. For instance, if both the first lock detect signal XLD1 and the second lock detect signal XLD2 of FIG. 2 are asserted, then the process 700 can proceed to block 704.

At block 704, a request to re-phase the output clock signals can be provided. Such a request can be communicated from the control module 252 to the divider and phase control circuit 254 FIG. 3, for example. In the embodiment of FIG. 3, the control module 252 can initiate output clock configuration operations to align phases of the output clocks OCLK1, OCLK2, and OCLKn with respect to the system reference SysRef at block 704.

The progress of re-phasing can be monitored at block 706. This can monitor whether the output clock signals are ready. If the output clock signals are not determined to be ready, the progress of re-phase can continue to be monitored at block 706. When it is determined at block 706 that all output clock configuration operations related to signal phasing have been completed, the system ready flag can be toggled at block 708. For instance, in the embodiment of FIG. 3, the rephrasing complete decision can correspond to checking if each finite state machine 294*a* to 294*c* is in a done state or has ceased to request a clock signal for a threshold period of time. At block 708, the controller 278 changes the state of the system ready signal SysReady to indicate a ready condition.

Devices employing one or more of the above described clock generation circuits can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, a phone such as a smart phone, a laptop computer, a tablet computer, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical and automotive applications.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Thus, although the various schematics shown in the figures depict example arrangements of elements and components, additional intervening elements, devices, features, or components may be present in an actual embodiment (assuming that the functionality of the depicted circuits is not adversely affected). Additionally, the words "herein," "above," "below," and words of similar import, when used in this application, shall refer to this application as a whole and not to any particular portions of this application. Where the context permits, words in the Detailed Description of Certain Embodiments using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values or distances provided herein are intended to include similar values within a measurement error.

The teachings of the inventions provided herein can be applied to other systems, not necessarily the systems described above, including embodiments that do not provide all of the features and/or advantages set forth herein. The elements and acts of the various embodiments described above can be combined to provide further embodiments. The acts of the methods discussed herein can be performed in any order as appropriate. Moreover, the acts of the methods discussed herein can be performed serially or in parallel, as appropriate.

While certain embodiments have been described, these embodiments have been presented by way of example only, and are not intended to limit the scope of the disclosure. Indeed, the novel apparatus, systems, and methods described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. An apparatus comprising:
    a divider and phase control circuit configured to receive a reference clock signal and to provide output clock signals, the output clock signals each being frequency divided relative to the reference clock signal, and each of the output clock signals having a set phase when ready; and
    a system ready circuit in communication with the divider and phase control circuit, the system ready circuit configured to toggle a system ready signal responsive to determining that each of the output clock signals is ready.

2. The apparatus of claim 1, wherein each of the output clock signals have a set phase relative to a system clock signal when ready, the system clock signal having a lower frequency than the reference clock signal.

3. The apparatus of claim 1, wherein the divider and phase control circuit comprises:
    a plurality of programmable dividers each configured to frequency divide the reference signal; and
    one or more finite state machines configured to control the programmable dividers such that the output clock signals each have a desired frequency and to cause each of the output clock signals to have the set phase.

4. The apparatus of claim 3, wherein the one or more state machines comprise a separate state machine corresponding to each output clock signal, and wherein the system ready circuit is configured to toggle the system ready signal responsive to each of the separate state machines being in a done state.

5. The apparatus of claim 3, wherein the one or more state machines are configured to cause each of the output clock signals to have the set phase when ready at least partly by controlling one or more of the plurality or programmable dividers.

6. The apparatus of claim 1, wherein the divider and phase control circuit comprises:
    a plurality of programmable dividers each configured to frequency divide the reference signal; and
    a plurality of phase control circuits each configured to receive an output from a respective one of the programmable dividers and adjust a phase of the output from the respective divider.

7. The apparatus of claim 1, wherein the output clock signals are each frequency divided relative to the reference clock signal by an integer divisor.

8. The apparatus of claim 1, wherein the system ready circuit is embodied in a controller in communication with the divider and phase control circuit by way of a bus.

9. The apparatus of claim 1, wherein the system ready circuit and the divider and phase control are embodied within a single chip, and wherein the apparatus is configured to provide the system ready signal to an output contact of the single chip.

10. The apparatus of claim 1, further comprising a phase-locked loop configured to provide the reference clock signal to the divider and phase control circuit.

11. The apparatus of claim 1, further comprising:
    a second divider and phase control circuit configured to:
        receive a first clock signal of the output clock signals from the phase control circuit; and
        provide second output clock signals, the second output clock signals each being frequency divided relative to the first output clock signal of the output clock signals, and each of the second output clock signals having a set phase relative to another of the second output clock signals when ready; and
    a second system ready circuit configured to toggle a second system ready signal responsive to an indication that each of the second output clock signals is ready.

12. A clock distribution chip comprising:
    a phase-locked loop configured to generate a reference clock signal;
    a divider and phase control circuit configured to receive the reference clock signal from the phase-locked loop and to provide output clock signals that are frequency divided relative to the reference clock signal, each of the output clock signals having a set phase when ready; and
    a controller configured to provide, external to the clock distribution chip, a system ready signal indicative of whether each of the output clock signals is ready.

13. The clock distribution chip of claim 12, wherein the controller is configured to receive a lock detect signal from the phase locked loop and to provide a control signal to the divider and phase control circuit responsive to the lock detect signal indicating that the phase locked loop is locked.

14. The clock distribution chip of claim 12, further comprising an other phase locked loop configured to provide an input to the phase locked loop.

15. An electronically implemented method of detecting that output clock signals are ready, the method comprising:
    receiving a request to provide output clock signals having desired frequencies and known phases;
    controlling a divider and phase control circuit such that the divider and phase control circuit generates the output clock signals having the desired frequencies and the known phases, the divider and control circuit generating the output clock signals using a reference signal;
    monitoring whether the output clock signals are ready; and
    toggling a system ready signal responsive to determining that each of the output clock signals is ready.

16. The method of claim 15, further comprising detecting that a phase locked loop is locked, the phase locked loop providing the reference signal, wherein controlling is initiated responsive to detecting.

17. The method of claim 15, further comprising detecting that an other phase locked loop is locked, the other phase locked loop providing an input to the phase locked loop, wherein controlling is initiated response to detecting that the phase locked loop and the other phase locked loop are both locked.

18. The method of claim 15, wherein monitoring comprises detecting that one or more state machines of the divider and phase control circuit are in a done state.

19. The method of claim 15, wherein monitoring comprises detecting that one or more state machines have ceased to request a system clock signal, the system clock signal having a lower frequency than the reference signal.

20. The method of claim 15, wherein monitoring comprises determining that each of the output clock signals has a set phase relative to the reference signal.

* * * * *